(12) United States Patent
Richter et al.

(10) Patent No.: US 9,373,509 B2
(45) Date of Patent: Jun. 21, 2016

(54) FINFET DOPING METHOD WITH CURVILNEAR TRAJECTORY IMPLANTATION BEAM PATH

(71) Applicant: GLOBALFOUNDRIES Inc., Grand Cayman (KY)

(72) Inventors: Ralf Richter, Radebeul (DE); Stefan Flachowsky, Dresden (DE); Peter Javorka, Radeburg (DE); Jan Hoentschel, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/477,358

(22) Filed: Sep. 4, 2014

(65) Prior Publication Data

US 2016/0071731 A1  Mar. 10, 2016

(51) Int. Cl.
| | |
|---|---|
| *H01L 21/30* | (2006.01) |
| *C23C 14/48* | (2006.01) |
| *H01L 21/336* | (2006.01) |
| *H01L 21/265* | (2006.01) |
| *H01L 29/78* | (2006.01) |
| *H01L 29/66* | (2006.01) |
| *H01L 21/8234* | (2006.01) |
| *H01L 21/266* | (2006.01) |
| *H01L 21/3065* | (2006.01) |
| *H01J 37/32* | (2006.01) |

(52) U.S. Cl.
CPC ........ *H01L 21/26586* (2013.01); *H01L 21/266* (2013.01); *H01L 21/26513* (2013.01); *H01L 21/3065* (2013.01); *H01L 21/823431* (2013.01); *H01L 29/66803* (2013.01); *H01L 29/7851* (2013.01); *H01J 37/32412* (2013.01)

(58) Field of Classification Search
CPC .................. H01L 21/26526; H01L 29/66803; H01L 21/2236; H01L 21/2254; H01L 21/26586
USPC ............ 438/301, 513; 257/E21.435, E21.143
See application file for complete search history.

(56) References Cited

U.S. PATENT DOCUMENTS

| 2008/0132046 A1* | 6/2008 | Walther .................. H01J 37/08 438/513 |
| 2011/0256732 A1* | 10/2011 | Maynard et al. ............... 438/766 |

\* cited by examiner

*Primary Examiner* — Evan Pert
*Assistant Examiner* — Changhyun Yi
(74) *Attorney, Agent, or Firm* — Ditthavong & Steiner, P.C.

(57) ABSTRACT

A method to implant dopants onto fin-type field-effect-transistor (FINFET) fin surfaces with uniform concentration and depth levels of the dopants and the resulting device are disclosed. Embodiments include a method for pulsing a dopant perpendicular to an upper surface of a substrate, forming an implantation beam pulse; applying an electric or a magnetic field to the implantation beam pulse to effectuate a curvilinear trajectory path of the implantation beam pulse; and implanting the dopant onto a sidewall surface of a target FINFET fin on the upper surface of the substrate via the curvilinear trajectory path of the implantation beam pulse.

17 Claims, 6 Drawing Sheets

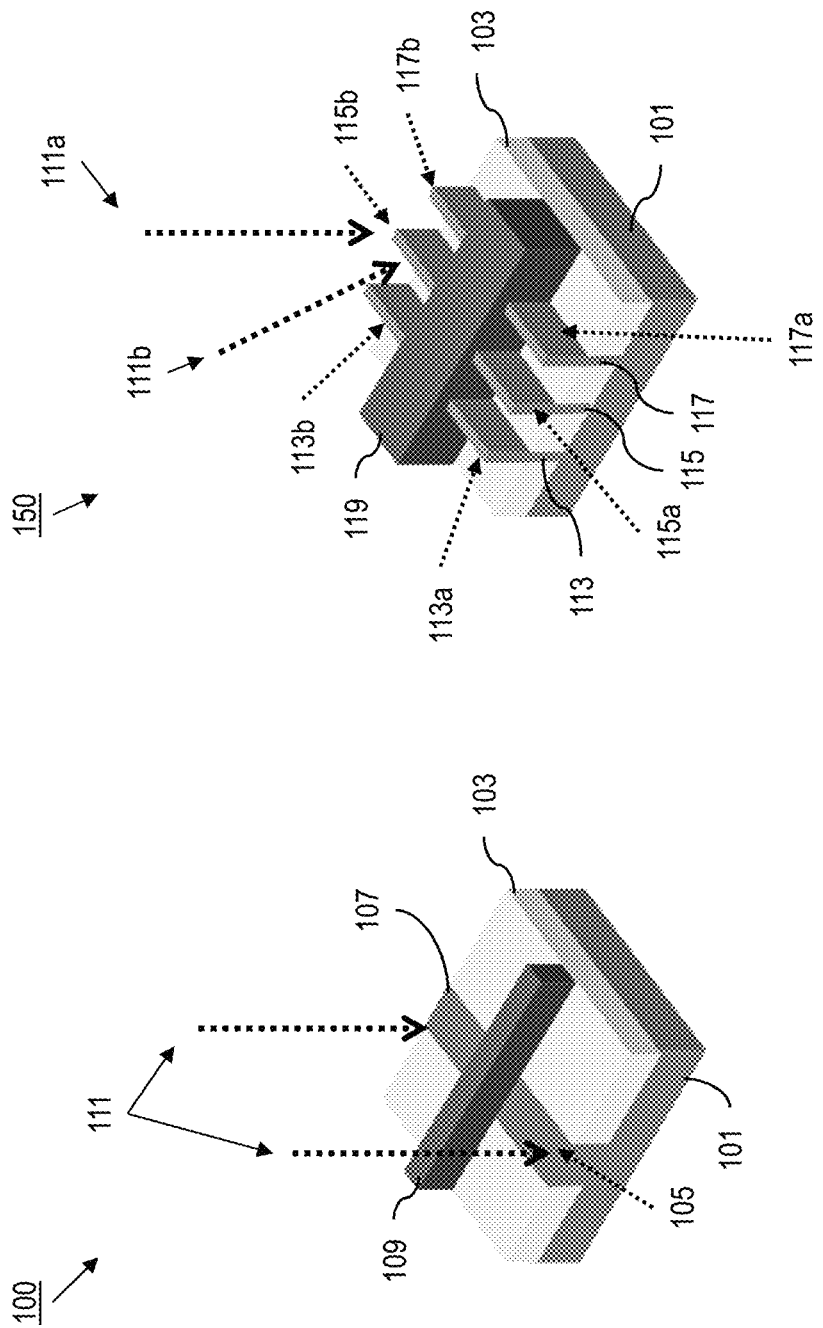

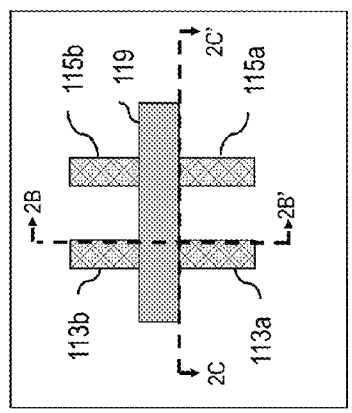
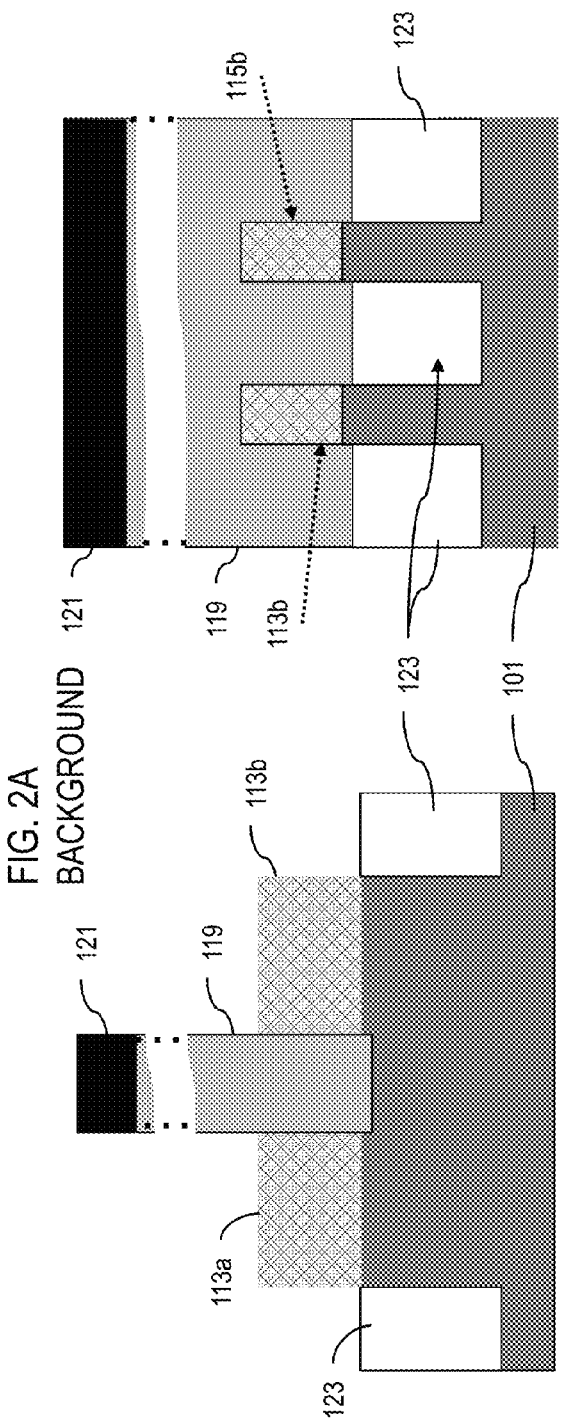

BACKGROUND

BACKGROUND

BACKGROUND

US 9,373,509 B2

FINFET DOPING METHOD WITH CURVILNEAR TRAJECTORY IMPLANTATION BEAM PATH

TECHNICAL FIELD

The present disclosure relates generally to implanting dopants in integrated circuits. The present disclosure is particularly applicable to implanting dopants in fin-type field-effect-transistor (FINFET) devices in integrated circuits, particularly for 22 nanometer (nm) and 14 nm technology nodes and beyond.

BACKGROUND

Generally, semiconductor materials (e.g., silicon) used in fabrication of integrated circuit (IC) devices are implanted with different dopants/ions (e.g., charge carries) in order to change the conductivity of the semiconductor material. The ion implantation may be performed during front-end-of-line (FEOL) processes or later during back-end-of-line (BEOL) processes. In one instance, when forming a transistor, corresponding areas for its source and drain regions in a polysilicon substrate may be implanted with an n-type or a p-type dopant to form an n-type or a p-type transistor, respectively. Usually, the implanting process utilizes an implantation beam pulse to accelerate and guide the ions to the target area on the substrate. However, with advances in IC design and fabrication technologies, IC area is reduced for improved active/idle power consumption, which introduces new challenges for the ion implantation processes. For example, ICs utilizing FINFET (e.g., tri-gate) devices require different considerations for implanting dopants on surfaces of the FINFET fins.

FIGS. 1A and 1B schematically illustrate transistors in example ICs. Adverting to FIG. 1A, diagram 100 is of a conventional planar metal-oxide-semiconductor field-effect-transistor (MOSFET), which includes a silicon substrate 101, an oxide layer 103, a source region 105, a drain region 107, and a logic gate 109. For a planar device such as in FIG. 1A, an ion implantation process may utilize an implantation beam pulse 111 that is substantially perpendicular to the source and drain region surfaces on the substrate 101.

FIG. 1B illustrates an example IC device 150 that includes a plurality of FINFET type transistors 113, 115, and 117, with a common logic gate 119, wherein each transistor includes corresponding source and drain structures, 113a and 113b, 115a and 115b, and 117a and 117b, which are formed around vertical FINFET fins on the substrate 101. The logic gate 119 wraps around the top and sidewall surfaces of each fin structure for controlling a current flow from the source to the drain region of the fin. Similar to the IC device in the example 100, the source and drain regions need to be implanted with dopants in order to facilitate the current drain from the source portion of the fin to the drain portion of the fin. However, a substantially vertical implantation beam pulse, such as pulse 111, may not be able to properly implant sidewall surfaces of the fins, nor can an angled or tilted beam, as limited spacing between adjacent fins may prevent (e.g., shadowing effects) implanting top and sidewall surfaces of each fin with uniform depths and concentration levels of dopants. For example, implanting beam pulse 111a may be utilized to implant top and sidewall surfaces of the drain 115b with dopants. However, the top surface of the drain 115b may be implanted with a higher concentration level when compared to its sidewall surfaces. Moreover, even if an angled/tilted implantation beam pulse 111b is utilized to implant a dopant onto the sidewall surfaces of the drain 115b, because of close proximity of drains 113b and 115b or the drains 115b and 117b, the sidewall surfaces of the drain 115b may not be uniformally or sufficiently implanted with the dopant. For performance and margin at a FINFET device, it is essential to minimize differences in implanting dopants on top and sidewall surfaces of the FINFET fins.

A need therefore exists for a methodology to implant dopants onto FINFET fin surfaces with uniform concentration and depth levels of the dopants and the resulting device.

SUMMARY

An aspect of the present disclosure is a FINFET device where surfaces of the FINFETs are implanted with uniform concentration and depth levels of dopants.

Another aspect of the present disclosure is a method for implanting dopants onto FINFET fin surfaces with uniform concentration and depth levels of the dopants.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including pulsing a dopant perpendicular to an upper surface of a substrate; forming an implantation beam pulse; applying an electric field to the implantation beam pulse to effectuate a curvilinear trajectory path of the implantation beam pulse; and implanting the dopant onto a sidewall surface of a target FINFET fin on the upper surface of the substrate via the curvilinear trajectory path of the implantation beam pulse.

Aspects include masking top and sidewall surfaces of one or more other FINFET fins adjacent to the target FINFET fin to prevent implantation of the one or more other FINFET fins with the dopant. In one aspect, the method includes applying a magnetic field to the implantation beam pulse. Further aspects include varying the curvilinear trajectory path of the implantation beam pulse by varying a strength, a direction, or a combination thereof of the electric field, the magnetic field, or a combination thereof. Some aspects include the electric field, the magnetic field, or a combination thereof being pulsed in synchronization with the implantation beam pulse.

In another aspect of the method, concentration levels of the dopant at a top surface and at a plurality of sidewall surfaces of the target FINFET fin are substantially the same. In one aspect of the method, depths of the concentration levels of the dopant at the top surface and at the plurality of sidewall surfaces of the target FINFET fin are substantially the same. A further aspect includes the curvilinear trajectory path being at an angle greater than 0 degree and less than 90 degrees with a reference to the sidewall surface of the target FINFET fin. An additional aspect includes applying a plurality of electric fields in different directions to the implantation beam pulse to effectuate the angle in the curvilinear trajectory path.

Another aspect of the present disclosure includes a device including: a substrate having an upper surface; a fin-type field effect transistor (FINFET) fin formed on the upper surface; and a top surface and a plurality of side surfaces of the FINFET fin implanted with a dopant, wherein concentration levels of the dopant at the top surface and at the plurality of sidewall surfaces of the FINFET fin are substantially same. In another aspect, the dopant is implanted via an implantation beam pulse varied by one or more electric fields, a magnetic field, or a combination thereof. A further aspect includes the dopant being implanted via an implantation beam pulse varied by one or more electric fields, a magnetic field, or a combination thereof. In one aspect, the depths of the concentration levels of the dopant at the top surface and at the plurality of side surfaces of the FINFET fin are substantially same.

Another aspect of the present disclosure includes a method including: forming a plurality of fin-type field effect transistor (FINFET) fins on an upper surface of a substrate, wherein each pair of adjacent FINFET fins is separated by a trench along the upper surface of the substrate; masking top and sidewall surfaces of one or more of the plurality of FINFET fins adjacent to a target FINFET fin in the plurality of FINFET fins; pulsing a dopant perpendicular to the upper surface of the substrate; forming an implantation beam pulse; applying an electric field to the implantation beam pulse to effectuate a curvilinear trajectory path of the implantation beam pulse; and implanting the dopant onto a sidewall surface of the target FINFET fin via the curvilinear trajectory path of the implantation beam pulse. In some aspects, the method includes applying a plurality of electric fields in different directions to the implantation beam pulse to effectuate the angle in the curvilinear trajectory path.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B schematically illustrate planar transistor and FINFET structures, respectively, in example IC devices;

FIG. 2A illustrates a top view and FIGS. 2B and 2C illustrate cross sectional views of an example IC device including FINFET type transistors;

DETAILED DESCRIPTION

Figure 3B:
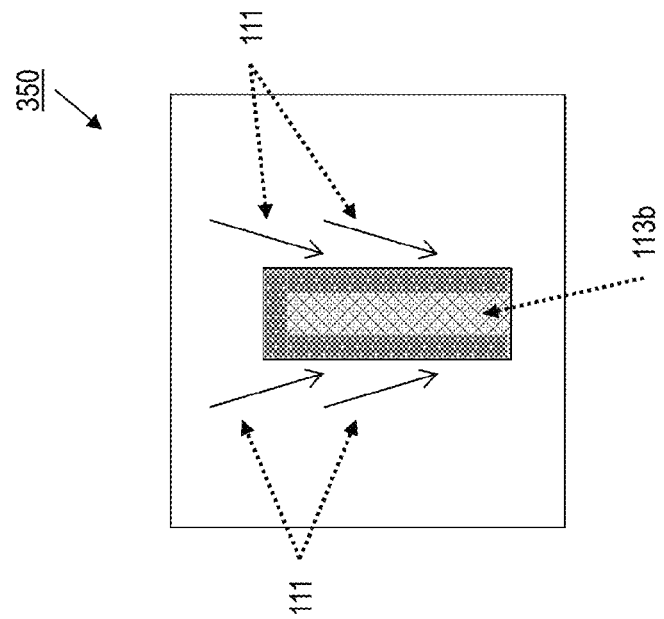
FIG. 3 illustrates a cross sectional view of an example IC device including a plurality of FINFET fins that are implanted with dopants.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of non-uniform depth and concentration levels of a dopant at the sidewall and top surfaces of a FINFET fin attendant upon implanting the dopant onto surfaces of FINFET fins. The present disclosure addresses and solves such problems, for instance, by, inter alia, utilizing electrical and magnetic fields to increase an effective implant angle of trajectory path of an implantation beam pulse such that the trajectory can be deviated from a linear path.

FIG. 2A illustrates a top view, and FIGS. 2B and 2C illustrate cross sectional views of an example IC device including FINFET type transistors. The IC device includes transistors 113 and 115, and FIGS. 2B and 2C illustrate cross-sectional views along lines 2B-2B' and 2C-2C', respectively. In diagram 200, the cross-sectional view along an edge of one fin includes substrate 101, a source 113a, drain 113b, logic gate 119, and a silicon nitride (SiN) cap 121 on upper surface of the logic gate 119. Additionally, to prevent electrical current leaking between adjacent transistors 113 and 115, shallow trench isolation (STI) regions 123 are etched into the substrate 101 and filled with dielectric materials, such as silicon dioxide ($SiO_2$), to isolate the transistors from each other. In diagram 250, a cross-sectional view along an edge of the logic gate 119 from FIG. 2A illustrates the substrate 101, drains 113b and 115b, the logic gate 119, the SiN cap 121, and the STI regions 123.

Figure 3A:
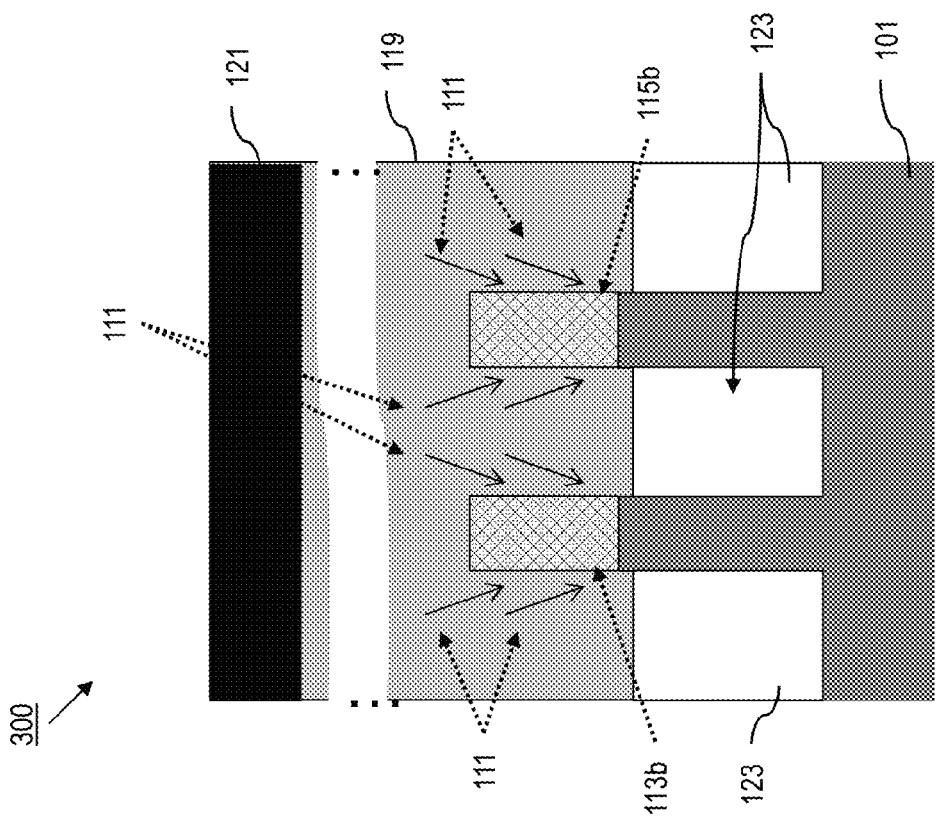
Figure 4:
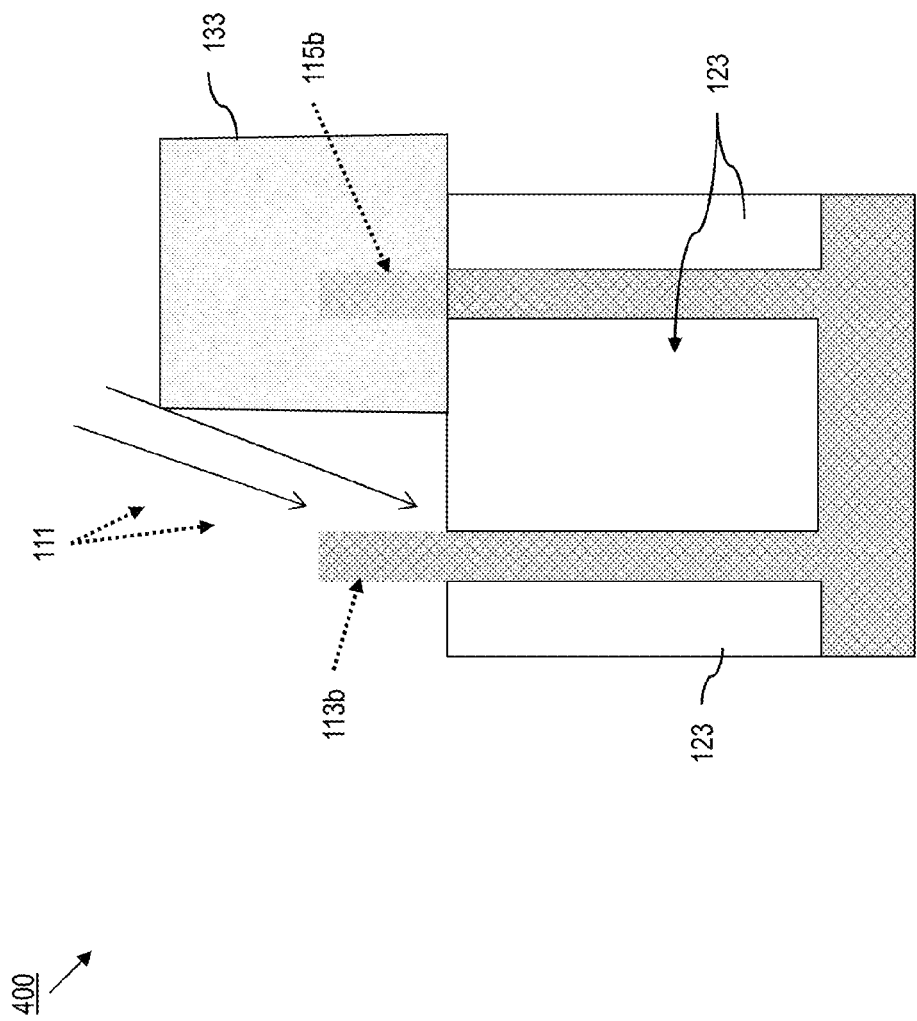
FIG. 4 illustrates a cross sectional view of an example IC device including a plurality of FINFET fins with one masked while the other is implanted with dopants.

Adverting to FIG. 3A, the diagram 300 further depicts implantation beams 111 that may be used to implant dopants onto the sidewall surfaces of the fins shown in FIG. 2C, for example for drains 113b and 115b. In FIG. 3B, diagram 350 illustrates a partial view of the fin 113b showing implanted dopants on sidewall surfaces as well as the top surface of the drain 113b via the implantation beams 111. Further, FIG. 4 illustrates diagram 400 in which the drain 115b, which is adjacent to the drain 113b, is covered with a photoresist mask layer 133 to prevent implanting dopants into drain 115b while the drain 113b is implanted with dopants via the implantation beam pulses 111. However, as discussed earlier, the implanting processes in the FIGS. 3A, 3B, and 4 may be insufficient for implanting the sidewall and top surfaces of the fins with the same depth and concentration levels of dopants where, for example, the trajectory paths and angles of the implantation beam pulses 111 cannot be controlled to provide a proper coverage of dopants onto the sidewall surfaces of the fins.

Figure 5:
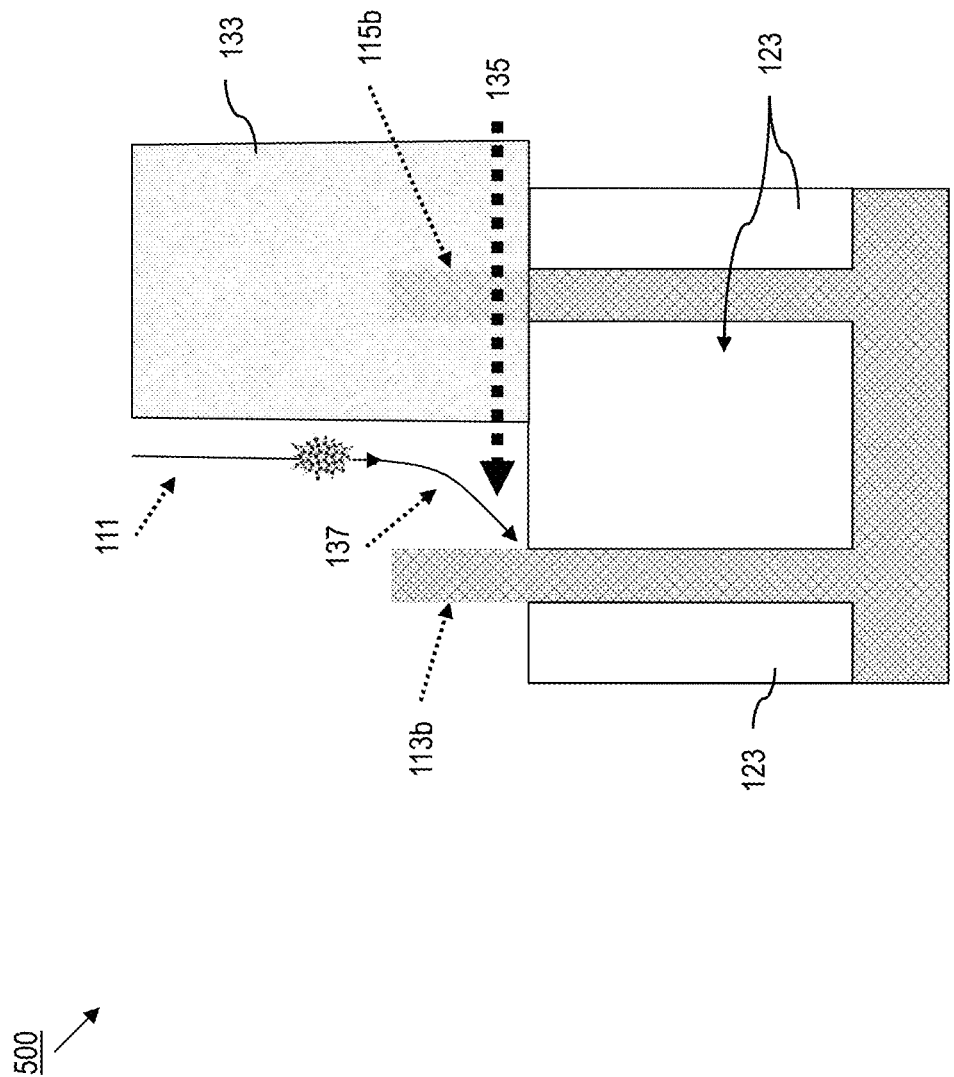
FIG. 5 illustrates a cross sectional view of example IC device in which an implantation beam pulse trajectory is altered using an electric field, in accordance with an exemplary embodiment.
Figure 6B:
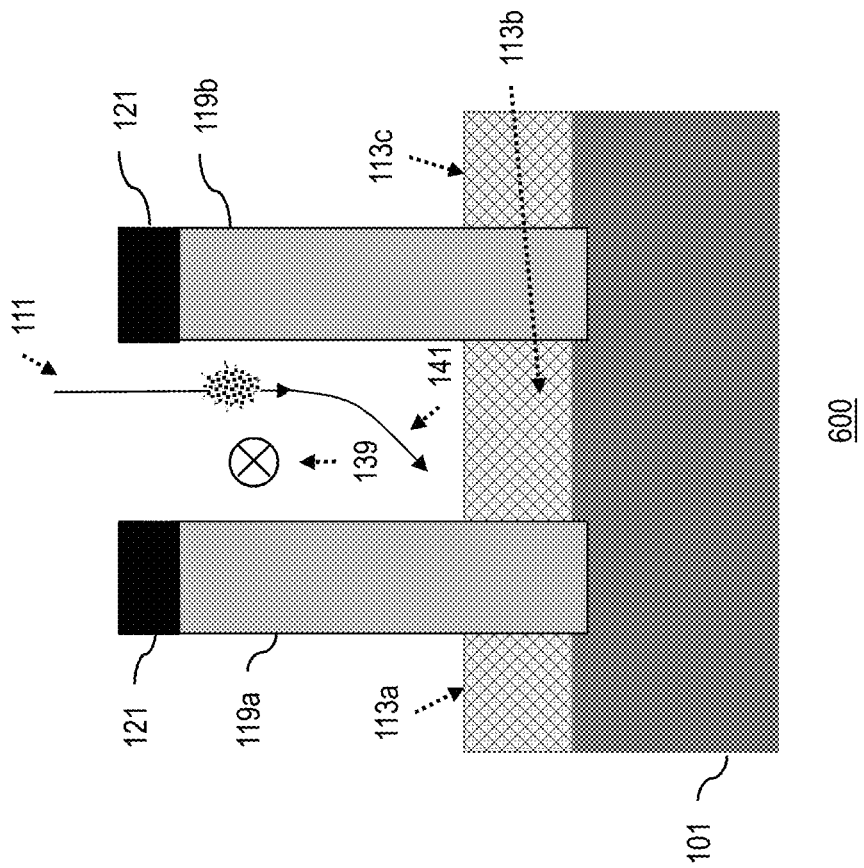
FIGS. 6A and 6B illustrate cross sectional views of an example IC device with multiple gates in which an implantation beam pulse trajectory is altered using an electric field and a magnetic field, respectively, in accordance with an exemplary embodiment.
Figure 6A:
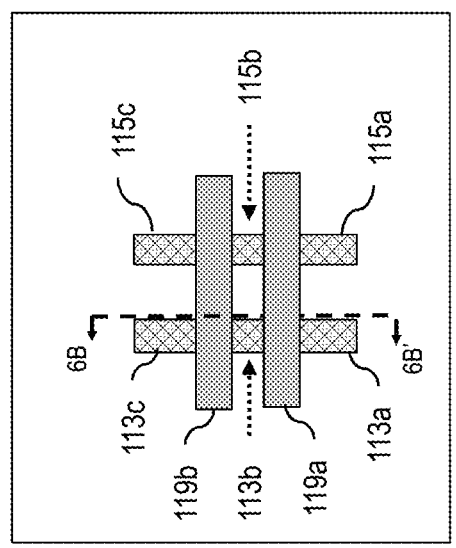

FIG. 5 illustrates a cross sectional view of an example IC device where a surface of a FINFET fin is implanted with dopants via implantation beam pulses with controlled trajectory paths, in accordance with an exemplary embodiment. FIG. 5 illustrates diagram 500 where trajectory path of an implantation beam pulse 111 is altered by applying an electric field 135 (e.g., by an ion implanting device) to provide a trajectory path 137 that may have a better angle (e.g., 45 degrees) with reference to the sidewall surfaces of the fin 113b so that the sidewall surfaces may be implanted with dopants to the same depth and concentration levels as the top surface of the fin 113b. Alternatively, a plurality of electric fields with different directions (not shown for illustrative convenience) may be applied to the implantation beam pulse 111, wherein the combined electric field is synchronized to the implantation beam pulse. FIGS. 6A and 6B illustrate top and cross-sectional view, respectively, of an IC device that includes multiple logic gates 119a and 119b, in accordance with an exemplary embodiment. As shown in FIG. 6B, along a cross-sectional line 6B-6B' in FIG. 6A, a magnetic field 139, with a direction perpendicular to plane in view, is applied to the implantation beam pulse 111 to produce a trajectory path 141. Alternatively, the electric field 137 shown in FIG. 5 as well as the magnetic field 139 may be simultaneously applied to the implantation beam pulse 111 (not shown for illustrative convenience), wherein the electric and magnetic fields are synchronized to the implantation beam pulse. By a simultaneous application of the electric and dynamic fields to an implantation beam pulse 111, the trajectory path may be simultaneously varied in one or more trajectory paths, e.g., 137 and 141. In one example, application strength of an electric field and/or a magnetic field may be determined based on a velocity of the ions/dopants to be implanted, their charge, geometry of a FINFET/implant layer, and a desired implant profile for a surface (e.g., sidewall) of a given FINFET fin.

The embodiments of the present disclosure can achieve several technical effects, including more uniform depth and concentration of dopants implanted into top and side surfaces of a FINFET fin, by applying an electric and/or a magnetic field to an implantation beam pulse. Further, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    pulsing a dopant perpendicular to an upper surface of a substrate, forming an implantation beam pulse;
    applying an electric field and a magnetic field simultaneously, at a target fin of a fin-type field effect transistor (FINFET), to the implantation beam pulse to effectuate a curvilinear trajectory path of the implantation beam pulse;
    varying the curvilinear trajectory path of the implantation beam pulse by varying a direction of the electric field and the magnetic field; and
    implanting the dopant onto a sidewall surface of the target FINFET fin on the upper surface of the substrate via the curvilinear trajectory path of the implantation beam pulse.

2. The method of claim 1, further comprising:
    masking top and sidewall surfaces of one or more other FINFET fins adjacent to the target FINFET fin to prevent implantation of the one or more other FINFET fins with the dopant.

3. The method of claim 1, further comprising:
    varying the curvilinear trajectory path of the implantation beam pulse by varying a strength of the electric field and the magnetic field.

4. The method of claim 1, wherein the electric field and the magnetic field are pulsed in synchronization with the implantation beam pulse.

5. The method of claim 1, wherein concentration levels of the dopant at a top surface and at a plurality of sidewall surfaces of the target FINFET fin are substantially the same.

6. The method of claim 5, wherein depths of the concentration levels of the dopant at the top surface and at the plurality of sidewall surfaces of the target FINFET fin are substantially the same.

7. The method of claim 1, wherein the curvilinear trajectory path is at an angle greater than 0 degree and less than 90 degrees with a reference to the sidewall surface of the target FINFET fin.

8. The method of claim 7, further comprising:
    applying a plurality of electric fields in different directions to the implantation beam pulse to effectuate the angle in the curvilinear trajectory path.

9. A device comprising:
    a substrate having an upper surface;
    a fin-type field effect transistor (FINFET) fin formed on the upper surface; and
    a top surface and a plurality of side surfaces of the FINFET fin implanted with a dopant, wherein concentration levels of the dopant at the top surface and at the plurality of side surfaces of the FINFET fin are substantially same, and
    wherein the dopant is implanted via an implantation beam pulse varied by at least one electric field and at least one magnetic field simultaneously applied at the FINFET fin.

10. The device of claim 9, wherein depths of the concentration levels of the dopant at the top surface and at the plurality of side surfaces of the FINFET fin are substantially same.

11. A method comprising:
    forming a plurality of fin-type field effect transistor (FINFET) fins on an upper surface of a substrate, wherein each pair of adjacent FINFET fins is separated by a trench along the upper surface of the substrate;
    masking top and sidewall surfaces of one or more of the plurality of FINFET fins adjacent to a target FINFET fin in the plurality of FINFET fins;
    pulsing a dopant perpendicular to the upper surface of the substrate, forming an implantation beam pulse;
    applying an electric field and a magnetic field simultaneously, at the target fin of the FINFET, to the implantation beam pulse to effectuate a curvilinear trajectory path of the implantation beam pulse;
    varying the curvilinear trajectory path of the implantation beam pulse by varying a direction of the electric field and the magnetic field; and
    implanting the dopant onto a sidewall surface of the target FINFET fin via the curvilinear trajectory path of the implantation beam pulse.

12. The method of claim 11, further comprising:
    varying the curvilinear trajectory path of the implantation beam pulse by varying a strength of the electric field and the magnetic field.

13. The method of claim 11, wherein the electric field and the magnetic field are pulsed in synchronization with the implantation beam pulse.

14. The method of claim 11, wherein concentration levels of the dopant at a top surface and at a plurality of sidewall surfaces of the target FINFET fin are substantially the same.

15. The method of claim 14, wherein depths of the concentration levels of the dopant at the top surface and at the plurality of sidewall surfaces of the target FINFET fin are substantially the same.

16. The method of claim 11, wherein the curvilinear trajectory path is at an angle greater than 0 degree and less than 90 degrees with a reference to the sidewall surface of the target FINFET fin.

17. The method of claim 16, further comprising:
applying a plurality of electric fields in different directions to the implantation beam pulse to effectuate the angle in the curvilinear trajectory path.

\* \* \* \* \*